(12) United States Patent
    Ha

(10) Patent No.: US 10,249,378 B1
(45) Date of Patent: Apr. 2, 2019

(54) FLASH MEMORY DEVICE AND METHOD FOR RECOVERING OVER-ERASED MEMORY CELLS

(71) Applicant: Winbond Electronics Corp., Taichung (TW)

(72) Inventor: Im-Cheol Ha, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/808,854

(22) Filed: Nov. 9, 2017

(51) Int. Cl.
    *G11C 16/34* (2006.01)
    *G11C 16/24* (2006.01)
    *G11C 16/12* (2006.01)

(52) U.S. Cl.
    CPC .......... *G11C 16/3477* (2013.01); *G11C 16/12* (2013.01); *G11C 16/24* (2013.01)

(58) Field of Classification Search
    None
    See application file for complete search history.

(56) References Cited

U.S. PATENT DOCUMENTS

| 5,998,826 | A | 12/1999 | Hung et al. | |
|---|---|---|---|---|
| 6,160,737 | A | 12/2000 | Hsu et al. | |
| 6,184,554 | B1* | 2/2001 | Chen | H01L 27/115 257/318 |
| 6,483,749 | B1* | 11/2002 | Choi | H01L 27/11521 257/E21.682 |
| 7,924,610 | B2 | 4/2011 | Chen et al. | |
| 2005/0078527 | A1 | 4/2005 | Liu et al. | |
| 2010/0172188 | A1* | 7/2010 | Chen | G11C 16/3404 365/185.22 |

FOREIGN PATENT DOCUMENTS

| CN | 101814322 | 8/2010 |
|---|---|---|
| TW | 508578 | 11/2002 |

* cited by examiner

*Primary Examiner* — James G Norman
(74) *Attorney, Agent, or Firm* — JCIPRNET

(57) ABSTRACT

This invention introduces a flash memory device and a method which are capable of quickly recovering the over-erased memory cells while preventing adverse influence to normal cells that are not over-erased. The flash memory device comprises a memory array and a memory controller coupled to the memory array. The memory controller is configured to select a memory block which comprises at least one over-erased memory cell. The memory controller is further configured to apply a negative voltage to the common bulk line and the common source line of the selected memory block. The memory controller is further configured apply a positive voltage to word lines that are coupled to the at least one over-erased memory cell in the selected memory block, and apply the positive voltage to word lines that are not coupled to any one of the at least one over-erased memory cell in the selected memory block.

16 Claims, 2 Drawing Sheets

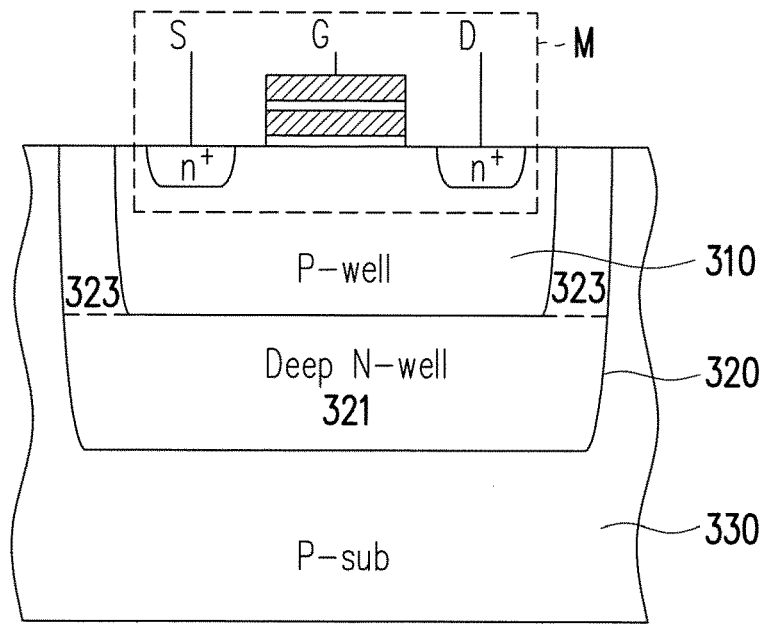

FIG. 3

| selecting a memory block which comprises at least one over-erased memory cell in the flash memory, wherein the selected memory block comprises a common bulk line and a common source line | ~402 |

| applying a negative voltage to the common bulk line and the common source line of the selected memory block | ~404 |

| applying a positive voltage to word lines that are coupled to the at least one over-erased memory cell in the selected memory block | ~406 |

FIG. 4

FLASH MEMORY DEVICE AND METHOD FOR RECOVERING OVER-ERASED MEMORY CELLS

BACKGROUND OF THE INVENTION

1. Field of the Invention

The invention relates to a flash memory device, and particularly relates to a flash memory device and a method which are capable of quickly recovering over-erased memory cells and preventing adverse influences to normal cells that are not over-erased.

2. Description of Related Art

Nowadays, flash memory device is applied to a wide variety of electronic equipment, such as digital camera, smartphone, etc. To satisfy market's demands, the flash memory device is required to be small in volume and large in capacity, and is further required to have high speed, low power consumption and high reliability in storing information.

The flash memory device performs an erase operation in a block-based unit (erase block unit) (such as 4K byte block, 32K byte block, 64K byte block) to erase data written to the flash memory device. A typical algorithm for erasing operation includes a sequence of a pre-program operation, an erase operation, a post-program operation and a refresh operation. The pre-program operation is used to write "0" to the memory cells of the erase block. The erase operation is used to write "1" to the memory cells of the erase block. The post-program program is used to recover over-erased memory cells after performing erase operation. The refresh operation is used to write "0" to data "0" in non-erased blocks.

A conventional post-program operation applies a drain voltage to the bit line that is coupled to the over-erased memory cell during the post-program operation. However, the bit line is shared by a plurality of cells which are not over-erased, thus the conventional post-program operation influences to the memory cells that are not over-erased. Additionally, the conventional post-program operation is performed according to bit line unit, thus requiring a long time to complete the post-program operation for the flash memory device.

Along with the popularity of flash storage devices, it is desirable to have a flash memory device and a method that are capable of quickly recovering the over-erased memory cells while preventing adverse influences to normal cells that are not over-erased.

SUMMARY OF THE INVENTION

This invention introduces a flash memory device and a method which are capable of quickly recovering the over-erased memory cells and preventing adverse influences to normal cells that are not over-erased. The flash memory device comprises a memory array and a memory controller coupled to the memory array. The memory controller is configured to select a memory block which comprises at least one over-erased memory cell, wherein the selected memory block comprises a common bulk line and a common source line. The memory controller is further configured to apply a negative voltage to the common bulk line and the common source line of the selected memory block. The memory controller is further configured apply a positive voltage to word lines that are coupled to the at least one over-erased memory cell in the selected memory block.

A plurality of memory cells of the flash memory device may be formed in triple-well structures. The selected memory block may have the same size as an erase block unit of an erase operation in the flash memory device.

The memory controller is further configured to apply the negative voltage to word lines that are not coupled to the at least one over-erased memory cell in the selected memory block. The memory controller may float bit lines which are coupled to memory cells of the selected memory block.

In an embodiment of the invention, a Fowler-Nordheim (FN) post-programming operation is used for recovering the over-erased memory cells, and a time period for performing the FN post-programming operation is determined according to a threshold voltage level of the over-erased memory cells of the selected block.

The method for recovering over-erased memory cells of the invention includes steps of selecting a memory block which comprises at least one over-erased memory cell in the flash memory device, applying a negative voltage to the common bulk line and the common source line of the selected memory block, and applying a positive voltage to word lines that are coupled to the at least one over-erased memory cell in the selected memory block.

In embodiments of the invention, the FN post-program operation is performed in a bock-based unit, where the size of the block may be the same as the size of the erase block unit of the erase operation. Furthermore, the bit lines of the selected block may be floated. In this way, the FN post-program operation is quickly performed and the adverse influences to the normal memory cells is prevented.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3 illustrates a schematic structure of a triple-well structure according to an embodiment of the invention.

FIG. 4 is a flowchart illustrating steps of a method for recovering over-erased memory cells according to an embodiment of the invention.

DESCRIPTION OF THE EMBODIMENTS

It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
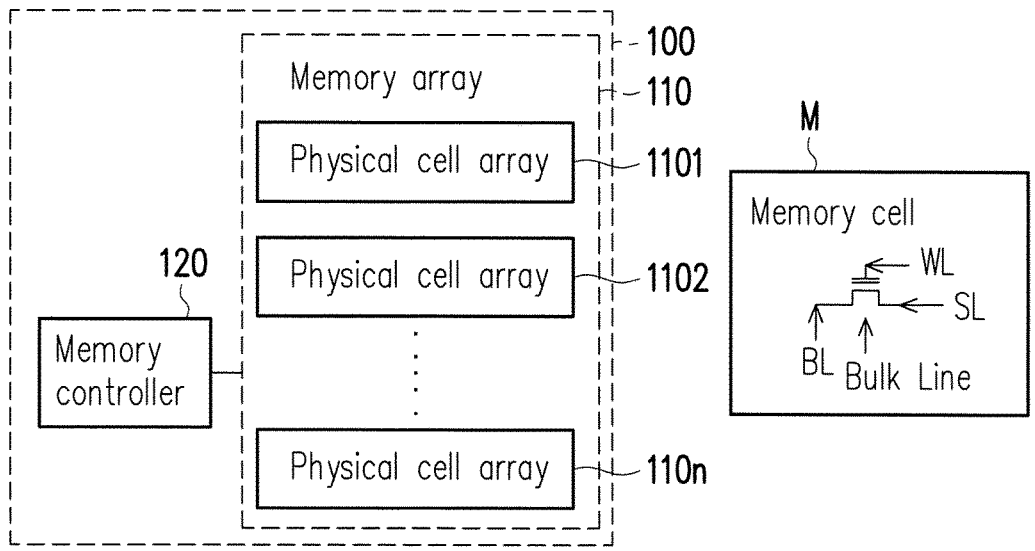
FIG. 1 illustrates a schematic diagram of a flash memory device according to an embodiment of the invention.

Referring to FIG. 1, a flash memory device 100 includes a memory array 110 and a memory controller 120 coupled to the memory array 110. The flash memory device 100 may be any type of flash memory device such as NOR flash memory device, NAND flash memory device. The memory array 110 includes a plurality of physical cell arrays 1101 to 110n which are electrically connected to each other. The number of the physical cell arrays 1101 to 110n in the flash memory device 100 depends a memory density, and is not limited in this invention.

For example, the flash memory device 100 may be a NOR flash memory device. Each of the physical cell arrays 1101 to 110n includes a plurality of 64K byte cell array, and each of the 64K byte cell array includes eight 4K byte cell array. The memory array 110 may be divided into a plurality of erasing block units, where the size of each erasing block unit is selected according to designed requirements. For example, the erasing block unit may be 4K byte block, 32K byte block, 64K byte block, but the invention is not limited thereto.

Each of the physical cell arrays 1101 to 110n includes a plurality of memory cells M. Each of the memory cells M includes a gate terminal G, a drain terminal D, a source terminal S and a bulk terminal B. The gate terminal G of the memory cell M may be connected to one of the word lines WL of the flash memory device 100. The drain terminal D of the memory cell M may be connected to one of the bit lines BL of the flash memory device 100. The source terminal S of the memory cell M may be connected to one of the source lines SL of the flash memory device 100, and the bulk terminal B of the memory cell M may be connected to one of the bulk lines of the flash memory device 100.

The memory controller 120 is coupled to the memory array 110, and is configured to control operations (read, program, erase, etc) of the flash memory device 100. The memory controller 120 may detect over-erased memory cells of the flash memory device 100. In an embodiment, the controller 120 may couple to a word line decoder (not shown) and a bit line decoder (not shown) to locate and access each of the memory cells of the flash memory device 100.

The memory controller 120 may include a single processor or multiple processors. The memory controller 120 is, for example, a micro-controller unit (MCU), a central processing unit (CPU), or other microprocessor, a digital signal processor (DSP), a programmable controller, application specific integrated circuits (ASIC), a programmable logic device (PLD), or other similar devices.

Figure 2:
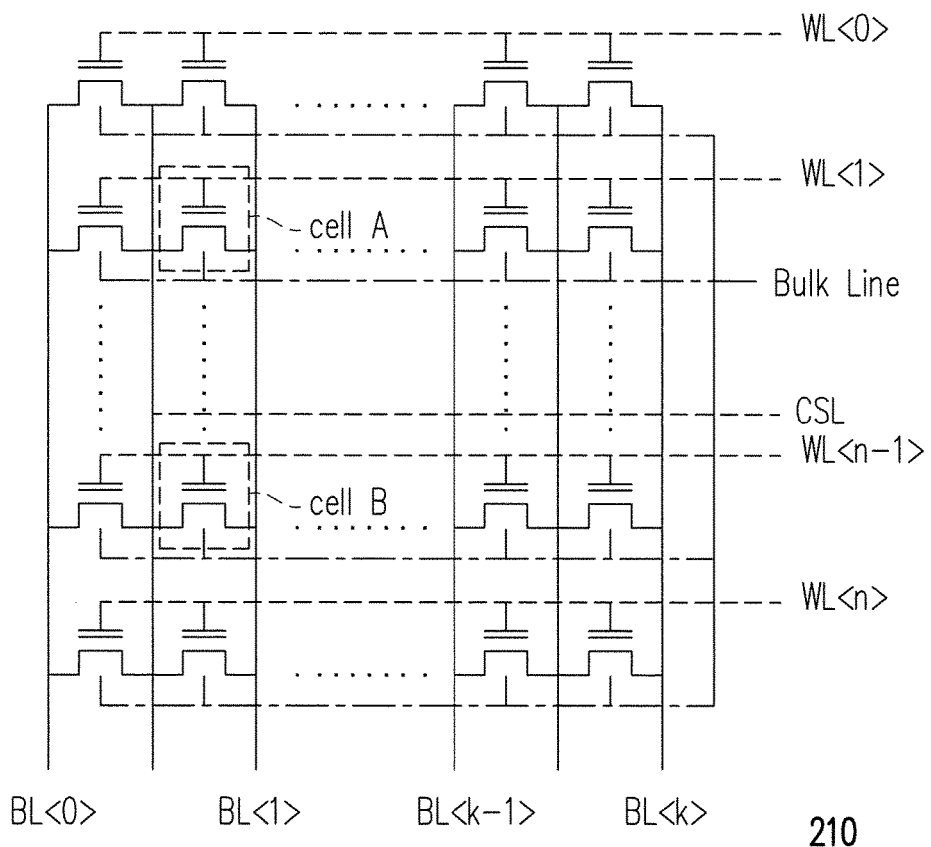
FIG. 2 illustrates a detailed structure of a memory array according to an embodiment of the invention.

FIG. 2 illustrates a plurality of memory cells arranged in an array to form a memory array 210. The memory cells of the memory array 210 are coupled to a plurality of bit lines BL <1> to BL <k>, a plurality of word lines WL <1> to WL <n>, a common source line CSL, and a common bulk line. Each of the memory cells has a gate terminal coupled to one of the word line WL <1> to WL <n>, a drain terminal coupled to one of the bit lines BL <1> to BL <k>, a source terminal coupled to the common source line CSL, and a bulk terminal coupled to the common bulk line. For example, the memory cell B has a gate terminal coupled to the word line WL <n−1>, a bit terminal coupled to the bit line BL <1>, a source terminal coupled to the common source line CSL, and a bulk terminal coupled to the common bulk line. Although FIG. 2 shows one common bulk line and one common source line CSL, the invention should not be limited thereto.

In an embodiment of the invention, the source terminals of memory cells are electrically coupled to the bulk terminals of the memory cells.

FIG. 2 further illustrates an over-erased memory cell A which is coupled to the bit line BL <1> and the word line WL <1>. For example, after being erased, the threshold voltage Vth of the memory cell A is a negative value due to erasing time being too long. In this case, the memory cell A is an over-erased memory cell. Since the memory cell A is over-erased (Vth is negative), the memory cell A continues to keep its "on" state even if the word line WL <1> coupled memory cell A is in non-selected state of "0" volt. If the memory cell A shares the bit line BL <1> with other memory cells, the bit line leaking may occur and a read operation on other memory cells which share the same bit line BL <1> with the over-erased memory cell A may be corrupted. Therefore, correction of over-erased memory cells is very important for erase operation of a flash memory device.

Referring to FIG. 1, FIG. 2 and Table 1, Table 1 shows an example of voltages applied to terminal of over-erased memory cells and non-over-erased memory cells in a selected memory block during the FN post-program operation. The selected memory block includes at least one over-erased memory cell, and the size of the selected memory block may be equal to the size of the erase block unit. For example, if an erase operation is executed in an erase block of unit of 32K bytes, then the selected memory block may be 32K byte block. Each of the selected memory block has a common source line, a common bulk line, a plurality of word lines and a plurality of bit lines.

TABLE 1

| WL | Over-erased memory cells VPPI | NOT over-erased memory cells VEEI-WL |
|---|---|---|
| Common Bulk Line | | VEEI |
| CSL | | VEEI |
| BL | | Floating |

Once a memory block which has at least one over-erased memory cell is selected, the memory controller 120 may apply a negative voltage VEEI to the common source line CSL and the common bulk line of the selected memory block. Meanwhile, the memory controller 120 may float all the bit lines and apply a positive voltage VPPI to word lines that are coupled to the gates of the over-erased memory cells in the selected block. The memory controller 120 applies a negative voltage VEEI-WL to the word lines that are not coupled to the gates of the over-erased memory cells in the selected block.

In an embodiment of the invention, the negative voltage VEEI applied to the common source line CSL and the common bulk line is equal to the negative voltage VEEI-WL applied to the word lines that are not coupled to the gates of the over-erased memory cells. However, the invention is not limited thereto, the negative voltage VEEI applied to the common source line CSL and the common bulk line may be greater or smaller than the negative voltage VEEI-WL applied to the word lines that are not coupled to the gates of the over-erased memory cells.

In an embodiment of the invention, the absolute value of the positive voltage VPPI applied to the word lines that are coupled to the gates of the over-erased memory cells is equal to the absolute value of the negative voltage VEEI applied to the common bulk line and the common source line CSL. In another embodiment, the absolute value of the positive voltage VPPI is equal to the absolute value of the negative voltage VEEI and is equal to the absolute value of the negative voltage VEEI-WL. However, the invention is not limited thereto, the absolute values of VPPI, VEEI and VEEI-WL may be different from each other.

It should be noted that the performance of FN post-programming operation for recovering the over-erased memory cells depends on the time period that the FN post-programming operation is performed (FN post-programming operation period). For example, the longer the FN post-programming operation period is, the higher the threshold voltages of the over-erased memory cells are. Therefore, the time period for performing FN post-programming operation (FN post-programming operation period) is determined according to threshold voltage levels of the over-erased memory cells. In an embodiment of the invention, the flash memory device 100 may further comprise a sensing circuit (not shown) which senses the threshold voltages to of the memory cells in the flash memory device. The FN post-programming operation in the selected memory block may be terminated when the sensed threshold values of all the over-erased memory cells in the selected memory block are greater than a non-zero threshold value. Any method for determining whether the over-erased memory cells are recovered to normal memory cells fall within the scope of this invention.

In an embodiment of the invention, the memory cells of the flash memory device 100 are formed in triple well structures. FIG. 3 illustrates a schematic structure of a memory cell M forming in a triple-well structure which includes an isolated P-well 310 surrounded by N-well 320. The N-well 320 may include a deep N-well 321 and a lateral isolation N-well 323, and all of the above wells are situated within a P-substrate 330. The triple well structure as shown in FIG. 3 may provide better isolation to the memory cell M by preventing noise from the substrate or from the other memory cells. FIG. 3 shows only one memory cell within the isolated P-well 310, but the invention is not limited thereto. More than one memory cells may be formed within the same isolated P-well 310.

In an embodiment of the invention, the bulk terminal of a memory cell is electrically coupled the source terminal of said memory cell within the triple well structure.

FIG. 4 illustrates steps of a method for recovering over-erased memory cells according to an embodiment of the invention. In step 402, the method selects a memory block which comprises at least one over-erased memory cell in the flash memory device, where the selected memory block may include a common bulk line, a common source line. In step 404, the method applies a negative voltage to the common bulk line and the common source line of the selected memory block. In step 406, the method applies a positive voltage to word lines that are coupled to the at least one over-erased memory cell in the selected memory block.

The method may apply a negative voltage to word lines that are not coupled to the at least one over-erased memory cell in the selected memory block, and float the bit lines of the selected memory block.

In summary, the embodiments of the invention introduce a flash memory device and a method for recovering over-erased memory cells using FN post-programming operation in the flash memory device. A negative voltage is applied to the common bulk line and the common source line while a positive voltage is applied to the word lines coupled to the over-erased memory cells. The FN post-programming operation may be performed in a block unit having a same size as the block unit of an erase operation, thereby reducing the time for recovering over-erased memory cells. The bit lines are floated, thereby preventing the adverse influence such as drain stress to the non-selected memory cells (the memory cells that are not over-erased). In this way, the invention may efficiently recover the over-erased memory cells and improve the reliability of the flash memory device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for recovering over-erased memory cells of a flash memory device using a Fowler-Nordheim (FN) post-programming operation, comprising:
   selecting a memory block which comprises at least one over-erased memory cell in the flash memory device, wherein the selected memory block comprises a common bulk line and a common source line;
   applying a negative voltage to the common bulk line and the common source line of the selected memory block; and
   applying a positive voltage to word lines that are coupled to the at least one over-erased memory cell in the selected memory block, wherein the negative voltage is smaller than zero volts and the positive voltage is greater than zero volts.

2. The method for recovering the over-erased memory cells according to claim 1, wherein memory cells of the flash memory device are formed in triple-well structures.

3. The method for recovering the over-erased memory cells according to claim 1, wherein the selected memory block has the same size as an erase block of an erase operation in the flash memory device.

4. The method for recovering the over-erased memory cells according to claim 1, further comprising:
   applying the negative voltage to word lines that are not coupled to any one of the at least one over-erased memory cell in the selected memory block.

5. The method for recovering the over-erased memory cells according to claim 4, wherein an absolute value of the negative voltage is equal to an absolute value of the positive voltage.

6. The method for recovering the over-erased memory cells according to claim 4, further comprising:
   floating bit lines which are coupled to memory cells of the selected block.

7. The method for recovering the over-erased memory cells according to claim 1, wherein a time period for performing FN post-programming operation for the selected block is determined according to a threshold voltage level of the at least one over-erased memory cells of the selected block.

8. The method for recovering the over-erased memory cells according to claim 1, wherein each of the memory cells of the flash memory device comprises a bulk terminal coupled to the common bulk line, a source terminal coupled to the common source line, a drain terminal coupled to one of the bit lines and a gate terminal coupled to one of the word lines.

9. A flash memory device, comprising:
   a memory array having a plurality of memory cells; and
   a memory controller, coupled to the memory array, the memory controller is configured to:

select a memory block which comprises at least one over-erased memory cell, wherein the memory block comprises a common bulk line and a common source line;

apply a negative voltage to the common bulk line and the common source line of the selected memory block; and apply a positive voltage to word lines that are coupled to the at least one over-erased memory cell in the selected memory block, wherein the negative voltage is smaller than zero volts and the positive voltage is greater than zero volts.

10. The flash memory device according to claim 9, wherein the plurality of memory cells of the flash memory device is formed in triple-well structures.

11. The flash memory device according to claim 9, wherein the selected memory block has the same size as an erase block of an erase operation in the flash memory device.

12. The flash memory device according to claim 9, wherein the memory controller is further configured to:

apply the negative voltage to word lines that are not coupled to any one of the at least one over-erased memory cell in the selected memory block.

13. The flash memory device according to claim 12, wherein an absolute value of the negative voltage is equal to an absolute value of the positive voltage.

14. The flash memory device according to claim 12, wherein the memory controller is further configured to:

float bit lines which are coupled to memory cells of the selected block.

15. The flash memory device according to claim 9, wherein a time period for performing FN post-programming operation for the selected block is determined according to a threshold voltage level of the at least one over-erased memory cells of the selected block.

16. The flash memory device according to claim 9, wherein each of the memory cells of the flash memory device comprises a bulk terminal coupled to the common bulk line, a source terminal coupled to the common source line, a drain terminal coupled to one of the bit lines and a gate terminal coupled to one of the word lines.

* * * * *